United States Patent
Gee et al.

(10) Patent No.: US 9,425,046 B1
(45) Date of Patent: Aug. 23, 2016

(54) METHOD FOR SURFACE ROUGHNESS REDUCTION AFTER SILICON GERMANIUM THIN FILM DEPOSITION

(71) Applicant: Crossbar, Inc., Santa Clara, CA (US)

(72) Inventors: Harry Yue Gee, Milpitas, CA (US); Steven Patrick Maxwell, Sunnyvale, CA (US); Natividad Vasquez, Jr., San Francisco, CA (US); Sundar Narayanan, Cupertino, CA (US)

(73) Assignee: Crossbar, Inc., Santa Clara, CA (US)

( * ) Notice: Subject to any disclaimer, the term of this patent is extended or adjusted under 35 U.S.C. 154(b) by 8 days.

(21) Appl. No.: 14/335,542

(22) Filed: Jul. 18, 2014

(51) Int. Cl.
| H01L 21/02 | (2006.01) |
| H01L 21/306 | (2006.01) |
| H01L 45/00 | (2006.01) |
| H01L 27/24 | (2006.01) |

(52) U.S. Cl.
CPC ...... *H01L 21/02664* (2013.01); *H01L 21/0262* (2013.01); *H01L 21/02532* (2013.01); *H01L 21/02587* (2013.01); *H01L 21/30625* (2013.01); *H01L 27/2436* (2013.01); *H01L 27/2463* (2013.01); *H01L 45/1608* (2013.01)

(58) Field of Classification Search
CPC ....... H01G 4/10; H01G 21/70; H01G 21/205; H01G 21/00
See application file for complete search history.

(56) References Cited

U.S. PATENT DOCUMENTS

| 5,130,885 A * | 7/1992 | Fazan et al. ....... H01L 27/10808 257/309 |
| 2002/0028541 A1 * | 3/2002 | Lee et al. ........... G11C 16/3427 438/149 |
| 2011/0312151 A1 * | 12/2011 | Herner ................. H01L 45/148 438/384 |

* cited by examiner

*Primary Examiner* — Fernando L Toledo
*Assistant Examiner* — Lawrence-Linh T Nguyen
(74) *Attorney, Agent, or Firm* — Amin, Turocy & Watson, LLP

(57) ABSTRACT

Techniques for processing silicon germanium (SiGe) thin films to reduce surface roughness thereof are provided herein. In an aspect, a method is disclosed that includes depositing a silicon germanium (SiGe) material upon a surface of a substrate at or below about 450 degrees Celsius, the substrate having a plurality of CMOS devices therein and forming, from the deposited SiGe material, a SiGe material film, wherein the SiGe material film has a jagged surface comprising projections and indentations extended along a direction substantially perpendicular to the surface of the substrate. The method further includes performing a chemical mechanical planarization (CMP) process to the jagged surface of the SiGe material, and reducing variations between the projections and the indentations along the direction substantially perpendicular to the surface of the substrate, and transforming the jagged surface of the SiGe material into a relatively smooth surface, compared to the jagged surface.

23 Claims, 11 Drawing Sheets

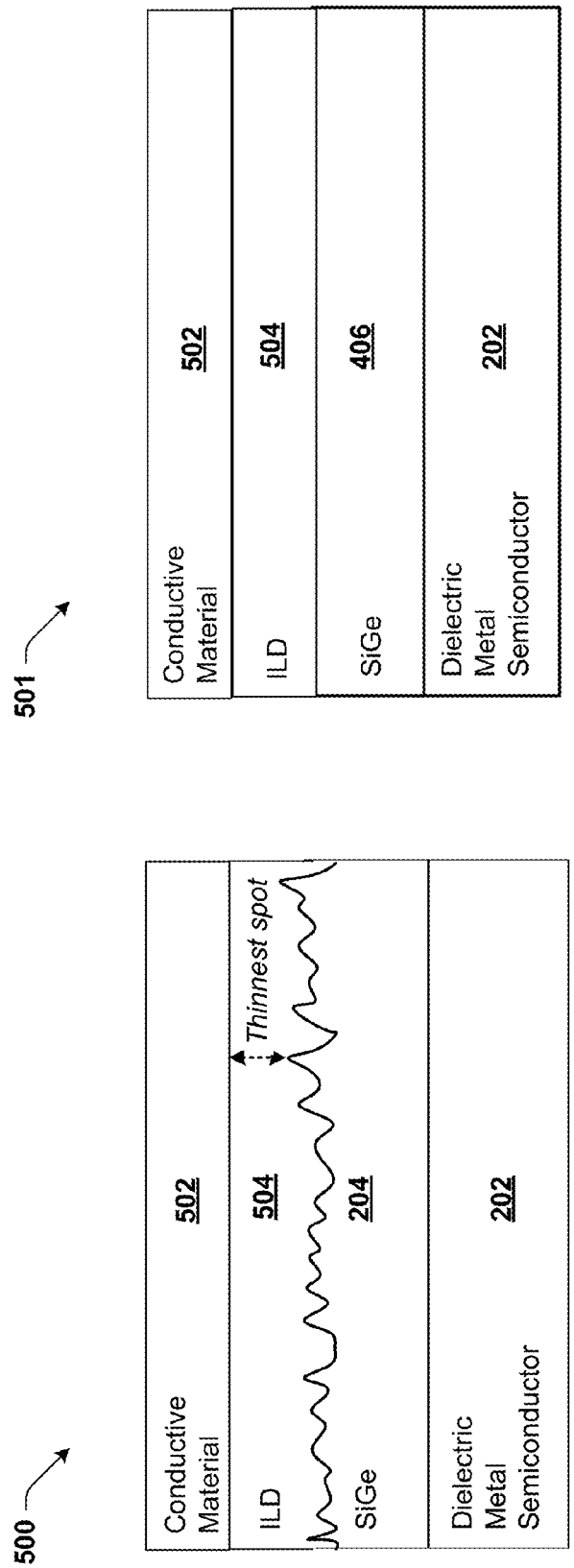

METHOD FOR SURFACE ROUGHNESS REDUCTION AFTER SILICON GERMANIUM THIN FILM DEPOSITION

TECHNICAL FIELD

This application relates generally to processing silicon germanium (SiGe) thin films to reduce surface roughness thereof following deposition for use in memory devices.

BACKGROUND

There is a continuous desire to increase the storage capacity of semiconductors as computers are consistently becoming more powerful and new and improved electronic devices are continually developed. One mechanism to increase memory capacity and processing power for the semiconductor chip and associated electronic devices aims to increase the number of semiconductors, such as transistors, that can be fabricated on a given geometric area of a semiconductor chip. A natural effect of this mechanism is the miniaturization of memory cells and associated elements formed on the semiconductor chip.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure;

FIGS. 5A and 5B depicts example memory cells employing SiGe thin films as bottom electrodes.

DETAILED DESCRIPTION

Figure 1:
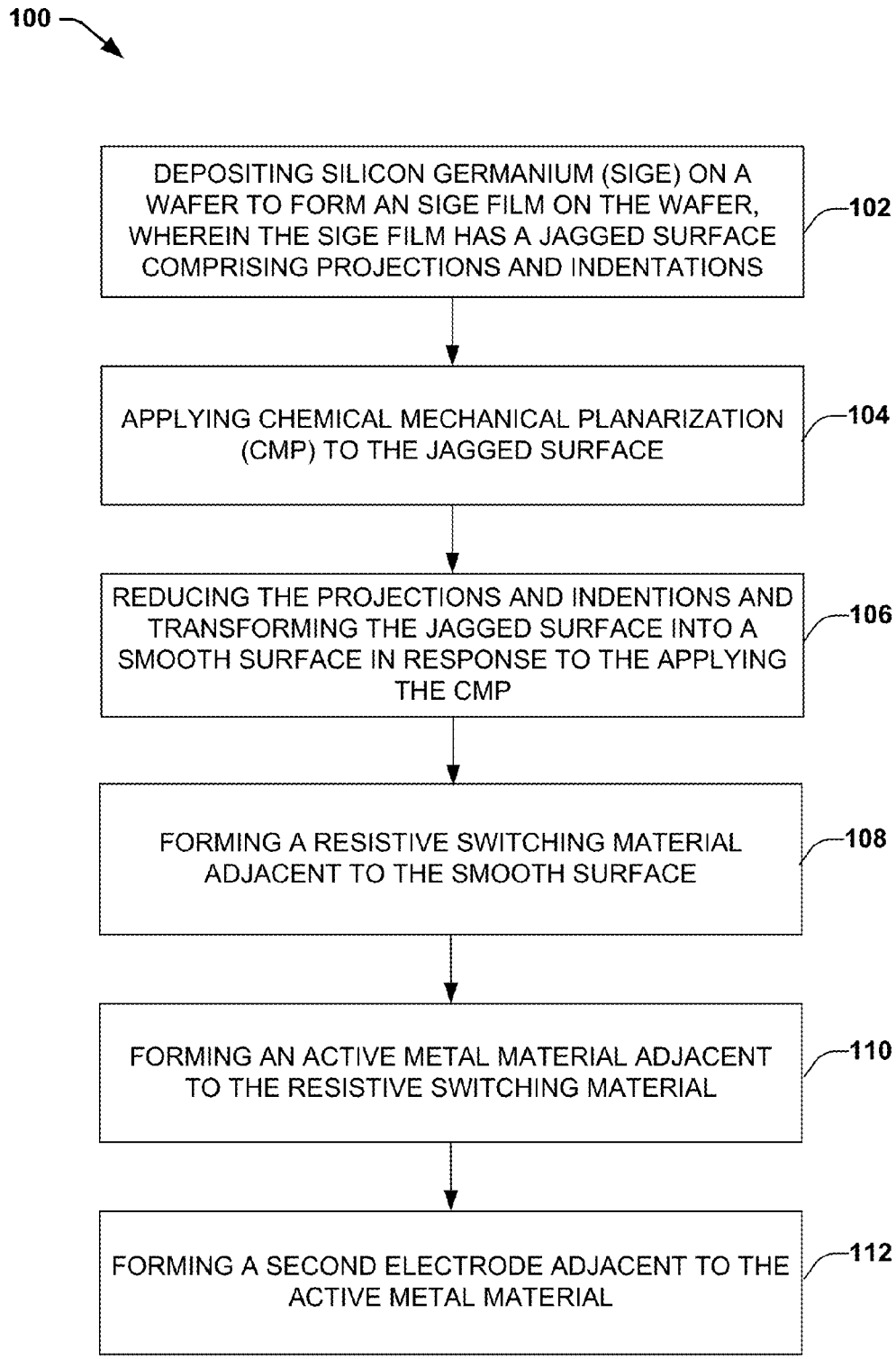
FIG. 1 illustrates a flow diagram of an example method for processing a SiGe thin film to reduce surface roughness thereof following deposition according to some embodiments of the subject disclosure.

The innovation is described with reference to the drawings, wherein like reference numerals are used to refer to like elements throughout. In the following description, for purposes of explanation, numerous specific details are set forth in order to provide a thorough understanding of this innovation. It may be evident, however, that the innovation can be practiced without these specific details. In other instances, well-known structures and components are shown in block diagram form in order to facilitate describing the innovation.

By way of introduction, the subject matter described in this disclosure relates to methods for processing SiGe thin films (e.g. p-doped polycrystalline silicon germanium material) to reduce surface roughness thereof following deposition for use of the SiGe thin films in memory devices. In particular, methods for reducing surface roughness of a SiGe thin film after deposition onto a substrate having one or more complementary metal-oxide-semiconductor (CMOS) devices thereon are provided. One of the basic building blocks in processing is the ability to deposit thin films of material with a thickness anywhere between a few nanometers (nm) to about 100 micrometers. One mechanism employed to deposit thin films of material includes chemical deposition. Chemical deposition techniques include chemical vapor deposition (CVD), in which a stream of source gas reacts on a selected substrate to grow a desired material. This can be further divided into categories, low pressure chemical vapor deposition (LPCVD) and plasma enhanced chemical vapor deposition (PECVD), depending on the details of the technique.

Figure 2:
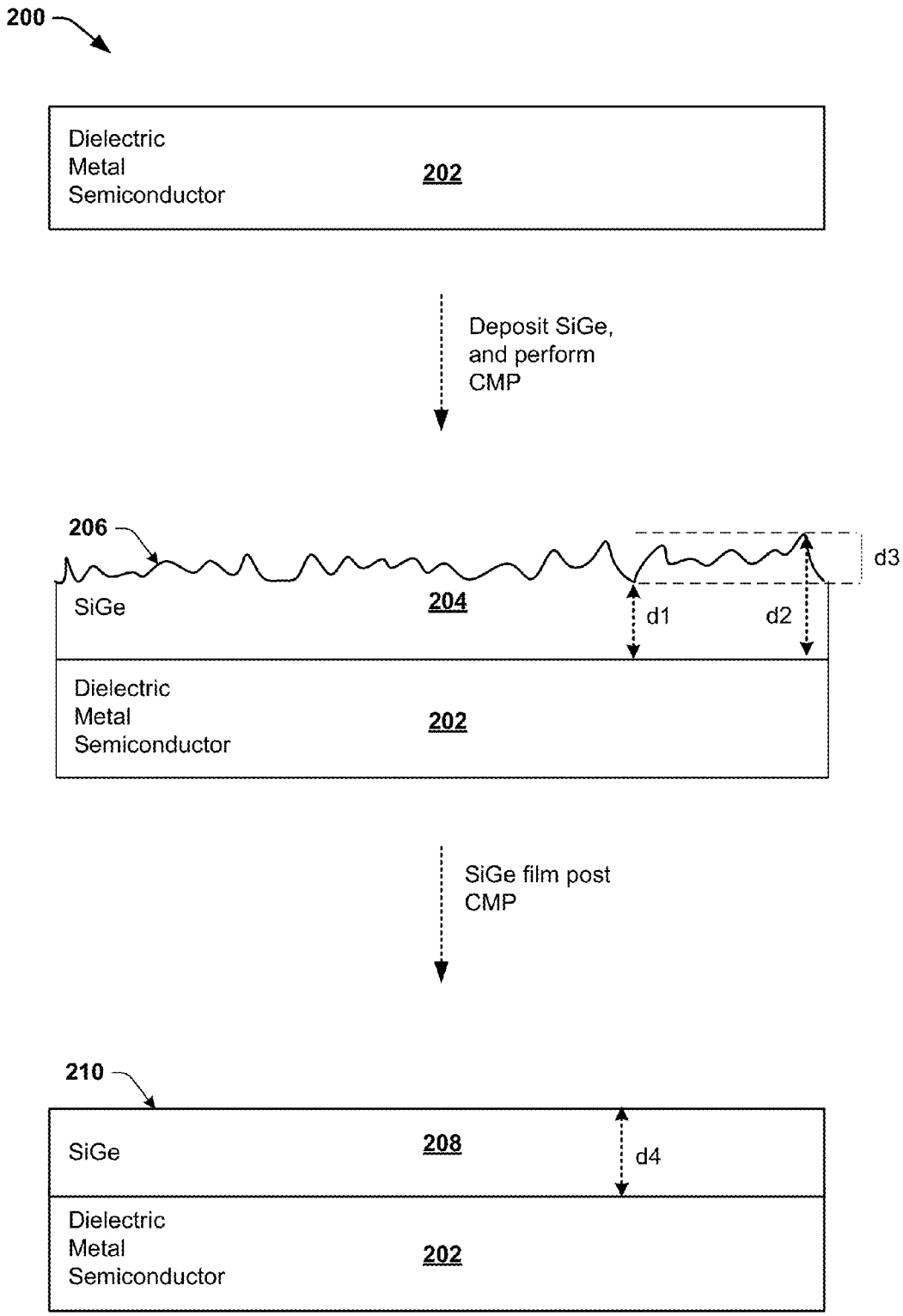
FIG. 2 depicts an example process for forming a SiGe thin film having a thickness less than 500 nm with a smooth surface following deposition of the SiGe thin film onto a planarized wafer substrate, in accordance with aspects and embodiments disclosed herein.

The inventors of the present disclosure have observed that in some cases, when SiGe is deposited using LPCVD or PECVD onto a substrate, the resulting thin film has a jagged or rough surface. The original surface roughness is a function of the crystallinity of the SiGe film which is a function of the process conditions as well as doping of the SiGe film. Additionally, because of deposition chamber variations, the SiGe film may have different thicknesses and different vertical height variation across a substrate. For example, FIG. 2 depicts a SiGe thin film layer 204 deposited onto a substrate layer 202 via LPCVD or PECVD. As seen in FIG. 2, the SiGe thin film layer 204 has a jagged surface 206. The jagged surface includes irregular formations of projections (or peaks) and indentations (or valleys).

Surface roughness of a SiGe film can be quantified using various metrics. In an aspect, surface roughness of the SiGe film is measured using a root mean squared (RMS) metric. In this respect, an RMS value representative of a degree of surface roughness of the SiGe film is the root mean square average of the profile height deviations from the mean line, recorded within the evaluation length. In particular, an RMS surface roughness measure of the SiGe film having a jagged horizontal surface formed onto a substrate is the square root of the sum of the squares of the individual heights and depths of the peaks (vertical projections) and valleys (vertical indentions), from a horizontal mean line relative to the peaks and valleys, wherein the horizontal mean line is parallel to the surface of the substrate. In an aspect, the SiGe thin film deposited onto a substrate using LPCVD or PECVD has a surface roughness of about 15-30 nm RMS.

The inventors are of the opinion that surface roughness of the SiGe thin film has many detrimental effects on subsequent processing and usage of the SiGe thin film for memory devices. For example, the inventors have observed that SiGe surface roughness causes photolithography critical dimension (CD) (also referred to as the minimum features size) variation and various other photolithography defects. These photolithography defects can subsequently lead to etch defects. The inventors also believe that SiGe surface roughness requires increased etch times to remove residual SiGe. Further, the inventors have observed that when a SiGe thin film is employed in a memory cell as an electrode, current leakage between the SiGe thin film and another electrode via a dielectric layer between the electrodes is exacerbated.

The inventors believe that negative effects associated with surface roughness of a SiGe thin film have not been previously recognized when employing SiGe thin films in memory devices. This is because devices have larger features and higher tolerances for thickness variations as well as defect levels. However, the negative effects associated with SiGe surface roughness significantly impact production and performance of memory devices due to the smaller feature sizes and pitches and the tighter tolerances required for thickness of film layers. The higher density and smaller technology nodes used in fabricating memory devices also requires lower defectivity levels as smaller defects caused by SiGe film surface roughness can become major defects for this type of devices.

Furthermore, in an exemplary embodiment, SiGe thin films can be utilized in constructing memory devices (e.g., two-terminal memory) on top of pre-existing CMOS circuitry. For instance, a SiGe component of a memory device can be deposited (e.g., using LPCVD or PECVD) onto a substrate that includes one or more CMOS components (e.g., transistors, metal lines, interconnects, power connections, sensors, and so on). Depositing and smoothing the surface of the SiGe layer thus also involves ensuring integrity of the underlying chemical and mechanical features of the CMOS components. For example, a planarization process performed at high temperatures (e.g., greater than 450° C.) can disrupt or destroy the metal circuitry of an underlying CMO device (e.g., soften the metal and harm structural integrity, change inter-line capacitance, alter the voltage outputs, etc.). In another example, a rough and forceful planarization process can damage the physical integrity of the CMOS device (e.g., cause cracks or bending). Accordingly, various aspects of the subject SiGe planarization process are optimized (e.g., temperatures, grit, pressure, removal rate, etc.) to minimize or eliminate damage to features of an underlying CMOS device.

The subject disclosure provides a method for reducing SiGe thin film surface roughness using chemical mechanical planarization (CMP). CMP is a process of smoothing surfaces with the combination of chemical and mechanical forces. In an aspect, a cleaning step is also performed on the SiGe thin film following CMP to remove surface defects caused by the CMP. For example, the post CMP cleaning can remove surface particles and remove 1.0 to 20.0 nm of a top layer of the SiGe to remove surface damage caused by CMP. Following CMP and post CMP cleaning, the surface roughness of the SiGe thin film is significantly reduced (e.g., by 50 to 100%), while the total thickness of the SiGe thin film is not substantially compromised. For example, where an initially deposited SiGe thin film has a thickness of about 300 nm with surface roughness spanning about the top 20 nm of the 300 nm and having a surface roughness of about 20 nm RMS, CMP can remove between about the top 20 to 40 nm of the SiGe thin film and reduce the surface roughness to less than 1.0 RMS (e.g., a total reduction in thickness of between about 6.7 to about 13.3%).

A resultant SiGe thin film having a substantially smooth or planarized surface facilitates fabrication of superior devices. For example, a SiGe thin film having a substantially smooth or planarized surface results in less CD variation and educed process defects at photolithography and etch steps. In addition, the smoother SiGe thin film reduces overetch time associated with clearing portions of the SiGe thin film from the substrate. Further, the smoother SiGe thin film reduces leakage current/shorts through a dielectric layer above the SiGe thin film when employed as an electrode in a memory cell.

The disclosed smooth SiGe thin films can be employed in a variety of memory cells. For example, the disclosed smooth SiGe thin films can be employed in two-terminal memory cells employed for digital information storage. In some embodiments, the two-terminal memory cells can include a resistive technology, such as a resistive-switching two-terminal memory cells. Resistive-switching two-terminal memory cells (also referred to as resistive-switching memory cells or resistive-switching memory), as utilized herein, comprise circuit components having two conductive contacts (also referred to herein as electrodes or terminals) with an active region (also referred to as a switching layer) between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be one or more specific voltage values, one or more specific current values, pulses having controlled duration or widths, pulses having controlled amplitudes or heights, signals of specific polarities, or the like, or a suitable combination thereof. An example of a resistive switching two-terminal memory device, though not exhaustive, can include a resistive random access memory (RRAM).

Embodiments of the subject disclosure can provide a filamentary-based memory cell. One example of a filamentary-based memory cell can comprise: a p-type or n-type silicon (Si) bearing layer (e.g., p-type or n-type polysilicon, p-type or n-type smooth SiGe thin film, etc.), a resistive switching layer (RSL) and an active metal layer for providing filament forming neutral atoms to the RSL, or for facilitating generation of filament forming ions within the RSL and migration into the RSL. In an exemplary embodiment, the p-type or n-type Si bearing layer is a smooth SiGe thin film layer formed using the various processes disclosed herein. The RSL (may also be referred to as a resistive switching media (RSM)) can comprise, e.g., an undoped amorphous Si layer, a semiconductor layer having intrinsic characteristics, a Si sub-oxide (e.g., SiOx wherein x has a value between 0.1 and 2), metallic oxide (e.g. Zinc Oxide) and so forth. Examples of the active metal layer can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), and palladium (Pd). Other suitable conductive materials, as well as compounds or combinations of the foregoing or similar materials can be employed for the active metal layer in some aspects of the subject disclosure. Some details pertaining to embodiments of the subject disclosure similar to the foregoing example can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

The inventors of the present application are of the opinion that two-terminal memory devices, such as resistive-switching memory devices, have various advantages in the field of electronic memory. For example, resistive-switching technology can generally be small, consuming silicon area on the order of $4F^2$ per resistive-switching device where F stands for the minimum feature size of a technology node (e.g., a memory cell comprising two resistive-switching devices would therefore be approximately $8F^2$ if constructed in adjacent silicon space). Non-adjacent resistive-switching devices, e.g., stacked above or below each other, can consume as little as $4F^2$ for a set of multiple non-adjacent devices. Moreover, multi-bit devices having two, three or more bits (e.g. resistance states) per memory cell can result in even greater densities in terms of bits per silicon area consumed. These advantages can lead to great semiconductor component density and memory density, and low manufacturing costs for a given number of digital storage bits. The inventors also believe that resistive-switching memory can exhibit fast programming speed and low programming current, and smaller cell sizes enabling greater component densities. Other benefits include non-volatility, having the capacity to store data without continuous application of power, and capacity to be built between metal interconnect layers, enabling resistive-switching based devices to be usable for two-dimension as well as three-dimension semiconductor architectures.

The inventors of the subject application are familiar with additional non-volatile, two-terminal memory structures. For example, ferroelectric random access memory (RAM) is one example. Some others include magneto-resistive RAM, organic RAM, phase change RAM and conductive bridging RAM, and so on. Two-terminal memory technologies have differing advantages and disadvantages, and trade-offs between advantages and disadvantages are common. For instance, various subsets of these devices can have relatively fast switching times, good durability, high memory density, low cost fabrication, long life, or the like, or combinations thereof. Meanwhile, the various subsets can also be difficult to fabricate, have compatibility problems with many common CMOS fabrication processes, poor read performance, small on/off resistance ratios, small on/off resistance ratios (e.g., leading to small sensing margin) or poor thermal stability, as well as other problems. Though resistive-switching memory technology is considered by the inventors to be one of the best technologies having the most benefits and least detriments, disclosed SiGe thin films can be employed for other two-terminal memory technologies, where suitable to one of ordinary skill in the art.

In an aspect, a method is disclosed that includes depositing a silicon germanium (SiGe) material upon a surface of a substrate at or below about 450 degrees Celsius, the substrate having a plurality of CMOS devices therein and forming, from the deposited SiGe material, a SiGe material film, wherein the SiGe material film has a jagged surface comprising projections and indentations extended along a direction substantially perpendicular to the surface of the substrate. The method further includes performing a chemical mechanical planarization (CMP) process to the jagged surface of the SiGe material, and reducing variations between the projections and the indentations along the direction substantially perpendicular to the surface of the substrate, and transforming the jagged surface of the SiGe material into a relatively smooth surface, compared to the jagged surface.

In another aspect, a method is disclosed that includes providing a planarized substrate having a plurality of CMOS devices formed therein and having at least one metal layer comprising a metal having a softening temperature below about 450 degrees Celsius and forming, above the at least one metal layer, a silicon germanium (SiGe) material film, wherein the SiGe material film has a jagged surface comprising projections and indentions extending in a substantially orthogonal direction to the planarized substrate. The method further includes smoothing the jagged surface by applying a chemical mechanical planarization (CMP) process to the jagged surface to reduce variations between the projections and the indentions in the substantially orthogonal direction, and to transform the jagged surface into a substantially planarized surface. The method further includes forming at least one additional layer which, in conjunction with the metal layer and the SiGe material film having the substantially planarized surface, forms a discrete stack of layers operable as a two-terminal memory device Further disclosed is a memory cell including a planarized substrate having a plurality of CMOS devices formed therein, a first conductive layer formed on the planarized substrate and a SiGe material film formed over the planarized substrate and in contact with the first conductive layer, wherein the SiGe material film has a thickness less than about 350 nm and a planarized surface opposite a surface of the SiGe material film contacting the first conductive layer, wherein the planarized surface is formed at least in part using chemical mechanical planarization (CMP) applied to the SiGe material film as-deposited, and comprises a surface roughness that is less than 1.0 nm rms following application of the CMP. The memory device further includes a dielectric layer formed over the SiGe film material and a second conductive layer formed over the dielectric layer. In one embodiment, the planarized surface of the SiGe thin film has a degree of surface roughness that is less than 1.0 nm RMS for a total removal of 20 nm SiGe on top of the original jagged surface. The amount removed is a function of the original surface roughness. For example, if the original roughness is 20 nm RMS and the amount of SiGe removed by CMP is between 20 nm and 40 nm, then the final surface roughness achieved is less than 1.0 nm RMS.

Referring now to the drawings, FIG. 1 presents a flow diagram of an example method 100 for processing a SiGe thin film to reduce surface roughness thereof following deposition according to one or more disclosed embodiments. At 102, SiGe is deposited on a substrate to form a SiGe thin film on the substrate. The substrate material of can vary. In an aspect, the wafer has a planarized surface and is formed via a metal dielectric or a semiconductor material. In various embodiments, the SiGe thin film is in electrical contact with a first electrode layer, (e.g., aluminum, copper, Ti, TiN, W, or the like). In an exemplary embodiment, the substrate includes a semiconductor wafer having one or more CMOS devices formed thereon.

In an aspect, the SiGe is deposited via low temperature LPCVD or PECVD. For example, where the SiGe is deposited onto a substrate that includes one or more CMOS devices formed thereon, high temperature CVD can damage the chemical and physical integrity of the one or more CMOS devices. In an aspect, the SiGe is deposited using LPCVD or PECVD at a temperature of about 250° C. to about 450° C. In another aspect, the SiGe is deposited using LPCVD or PECVD at a temperature of about 300° C. to about 400° C. In yet another aspect, the SiGe is deposited using LPCVD or PECVD at a temperature of about 325° C. to about 375° C.

The thickness of the SiGe thin film can vary. In an aspect, the thickness of the SiGe thin film is between about 5 and 500 nm. In another aspect, the thickness of the SiGe thin film is between about 100 and 400 nm. In another aspect, the thickness of the SiGe thin film is between about 200 and 450 nm. In yet another aspect, the thickness of the SiGe thin film is between about 250 and 350 nm. The deposited SiGe thin film has a rough or jagged surface based in part on the LCPVD or PECVD deposition. The rough/jagged surface is marked by irregularities, protuberances, or ridges. For example, FIG. 2 depicts an thin SiGe thin film 204 following LPCVD or PECVD deposition onto a planarized wafer 202. As seen in FIG. 2, the SiGe thin film has various irregular projections (or peaks) and indentations (or valleys).

At 104, CMP is applied to the jagged surface of the SiGe thin film to smooth the jagged surface (or decrease surface roughness). At 106, the projections and indentions of the jagged surface are reduced as a result of the CMP. The rough/jagged surface of the SiGe thin film is thus transformed into a smooth surface. In an aspect, the surface roughness is reduced by more than 50%. In another aspect, the surface roughness is reduced by more than 65%. In another aspect, the surface roughness is reduced by more than 75%. In another aspect, the surface roughness is reduced by more than 90%. Still in yet another aspect, the surface roughness is reduced by 100%.

In an aspect, after the surface roughness of the SiGe thin film is reduced at step 106, one or more additional layers can be applied over the SiGe thin film to form a discrete stack of layers that can be operable as a memory cell (e.g., a two-terminal memory cell). For instance, the memory cell can be formed at least in part using the SiGe thin film, a first conductive layer (e.g., between the SiGe thin film and planarized wafer 202), a memory layer (e.g., a resistive switching layer) and a second conductor, and operated at least in part by the one or more CMOS devices of the underlying substrate (which can include, for example, wiring structures, metal interconnects, electronic sensors such as current sensors, voltage sensors, charge sensors, or the like, power sources, rectifiers, ground connects, and so on). In an aspect, the memory cell is a two-terminal memory cell. In an exemplary embodiment, the memory cell is a resistive random access memory (RRAM, or ReRAM) device. For instance, at 108, a resistive switching layer/material can be formed adjacent the smooth surface of the SiGe thin film. In an aspect, the resistive switching layer/material is selected from a group consisting of undoped amorphous silicon material, non-crystalline silicon material, intrinsic silicon, an silicon-sub-oxide, or the like, or a suitable combination thereof. Then at 110, an active metal layer can be formed adjacent to the resistive switching material/layer. In an aspect, the active metal layer is selected from a group consisting of aluminum, silver, platinum, palladium, gold, or the like, or a suitable combination of the these active metals. Further, at 112, a second electrode layer can be formed adjacent to the active metal material. The second electrode can include aluminum, copper, Ti, TiN, W, or the like, or a suitable combination of the foregoing.

FIG. 2 depicts an example process 200 for forming a SiGe thin film having a thickness less than 500 nm with a smooth surface following deposition of the SiGe thin film onto a planarized wafer substrate in accordance with aspects and embodiments described herein. Repetitive description of like elements employed in respective embodiments of processes and devices described herein is omitted for sake of brevity.

Process 200 begins with obtaining a substrate 202 for which to deposit a SiGe thin film. The substrate material can vary. For example, the substrate 202 can include a planarized wafer formed with a dielectric, a metal and/or a semiconductor material. In an exemplary embodiment, the substrate 202 includes a semiconductor wafer having one or more CMOS devices formed thereon.

After obtaining the substrate material 202, a SiGe thin film 204 is deposited onto the substrate via low temperature (e.g. about 250° C. to about 450° C.) LPCVD or PECVD. The SiGe thin film 204 formed as a result of the LPVD or PECVD has a jagged or rough surface 206. As previously noted, the thickness of the SiGe thin film 204 can vary. However, in an exemplary embodiment, the thickness of the SiGe thin film is between about 30 and 350 nm. In an aspect, the thickness of the SiGe thin film 204 can be measured by a distance from a highest surface peak to the base of the SiGe thin film where the SiGe thin film meets the substrate 202 (e.g., distance d2). In another aspect, the thickness of the SiGe thin film 204 can be measured by a distance from a lowest surface trench or valley to the base of the SiGe thin film where the SiGe thin film meets the substrate 202 (e.g., distance d1).

In an aspect, the amount of surface roughness of the SiGe thin film 204 is measured as a function of the distance (e.g., in nanometers) between the highest surface peak and the lowest surface peak (e.g., distance d3 where d3=d2−d1). In particular, the amount of surface roughness of the SiGe thin film 204 includes a surface layer of the SiGe thin film that has a thickness or depth of d3. The amount of surface roughness of the SiGe thin film can vary based on the deposition process employed and the thickness of the SiGe thin film 204. In an aspect, the amount of surface roughness is about 10 nm to about 30 nm. In an exemplary embodiment, the amount of surface roughness is about 20 nm. In another aspect, the amount of surface roughness is between about 5% to about 20% of a total thickness of the SiGe thin film. For example, where the SiGe thin film 204 has a total thickness (e.g., measured by distance d2) of 300 nm, the amount of surface roughness (e.g., the top layer of the SiGe thin film having a thickness d3) can be from about 15 nm to about 60 nm.

After the SiGe thin film 204 is deposited, CMP is performed to reduce the amount of surface roughness of the SiGe thin film. Typically, the CMP process involves holding the thin SiGe film 204 against a rotating wetted polishing surface under a controlled downward pressure. A polishing slurry, such as a solution of alumina or silica, may be used as the abrasive medium. In an aspect, the polishing slurry employed includes between about 0% to about 20% $H_2O_2$ and has pH >9.0. A rotating polishing head or wafer carrier is generally employed to hold the SiGe thin film 204 substrate 202 to which the SiGe thin film is deposited, under controlled pressure against a rotating polishing platen. The polishing platen is typically covered with a relatively soft wetted pad material such as a blown polyurethane.

The mechanics of CMP involve a chemical reaction between the SiGe thin film and the polishing slurry followed by a mechanical removal of reaction products. The polishing pad facilitates removing reaction products at the SiGe thin film interface to facilitate layer thickness production. The polishing pads may vary, for example, in hardness and density. For example, pads can be relatively stiff or relatively flexible. A less stiff pad will conform more easily to the topography of a wafer and thus while reducing planarity may facilitate faster removal of material in down areas. Conversely, a stiffer pad may produce better planarity but may result in slower removal in down areas.

CMP is employed to reduce surface roughness of the SiGe thin film 204 to achieve greater planarity across the SiGe thin film 204, creating a desired film thickness uniformity. For example, after CMP is performed a resulting SiGe thin film 208 is created that includes a substantially smooth surface 210. In an aspect, the CMP processes can be employed to remove around 50% to 100% of the surface roughness of the SiGe thin film 204 (e.g., about the top 10-40 nm). For example, CMP can be performed to remove the top layer of the SiGe thin film 204 spanning the thickness d3. According, the thickness d4 of the resulting SiGe film 208 will be equal or substantially equal to d1. In another example, CMP is performed to remove a top layer of the SiGe thin film 204 spanning the thickness d3+X nm, where X is a number (e.g., 5 nm). According, the thickness d4 of the resulting SiGe film 208 will be greater than d1. In another aspect, CMP is performed to remove a top layer of the SiGe thin film 204 spanning the thickness d3−X nm, where X is a number (e.g., 5 nm). According, the thickness d4 of the resulting SiGe film 208 will be less than to d1.

The amount of SiGe removed from the SiGe thin film can vary based on the concentration of solids in the slurry (e.g. the number and size of abrasive particles suspended in the slurry), the chemical composition of the slurry (e.g. the pH of the slurry and/or the presence of acids or bases added to the slurry to facilitate chemical reactions associated with CMP processing), the distribution of the slurry, the degree of contact between one or more polishing pads, polishing pad attributes (e.g. porosity, density, flexibility), the rate at which slurry is fed onto polishing pads and/or the wafer and the size, number and arrangement of grooves machined into the bulk silicon wafer to channel slurry about the entire wafer surface. The degree of wafer-pad contact can, for example, affect the uniformity of slurry as polishing pads rotate and move relative to the wafer, thus, pushing slurry around on the wafer.

The rate at which CMP progresses may also vary depending on parameters of the slurry employed. Slurries may consist, for example, of small abrasive particles suspended in a solution (e.g., aqueous solution). Acids or bases can be added to such solutions to facilitate, for example, the oxidation of the metal on the wafer and/or other chemical reactions involved in other non-metal CMP processes. Slurry parameters that can impact polishing rates include, for example, the chemical composition of the slurry, the concentration of solids in the slurry, the solid particles in the slurry and the temperature of the wafer to which the slurry is applied.

Figure 3:
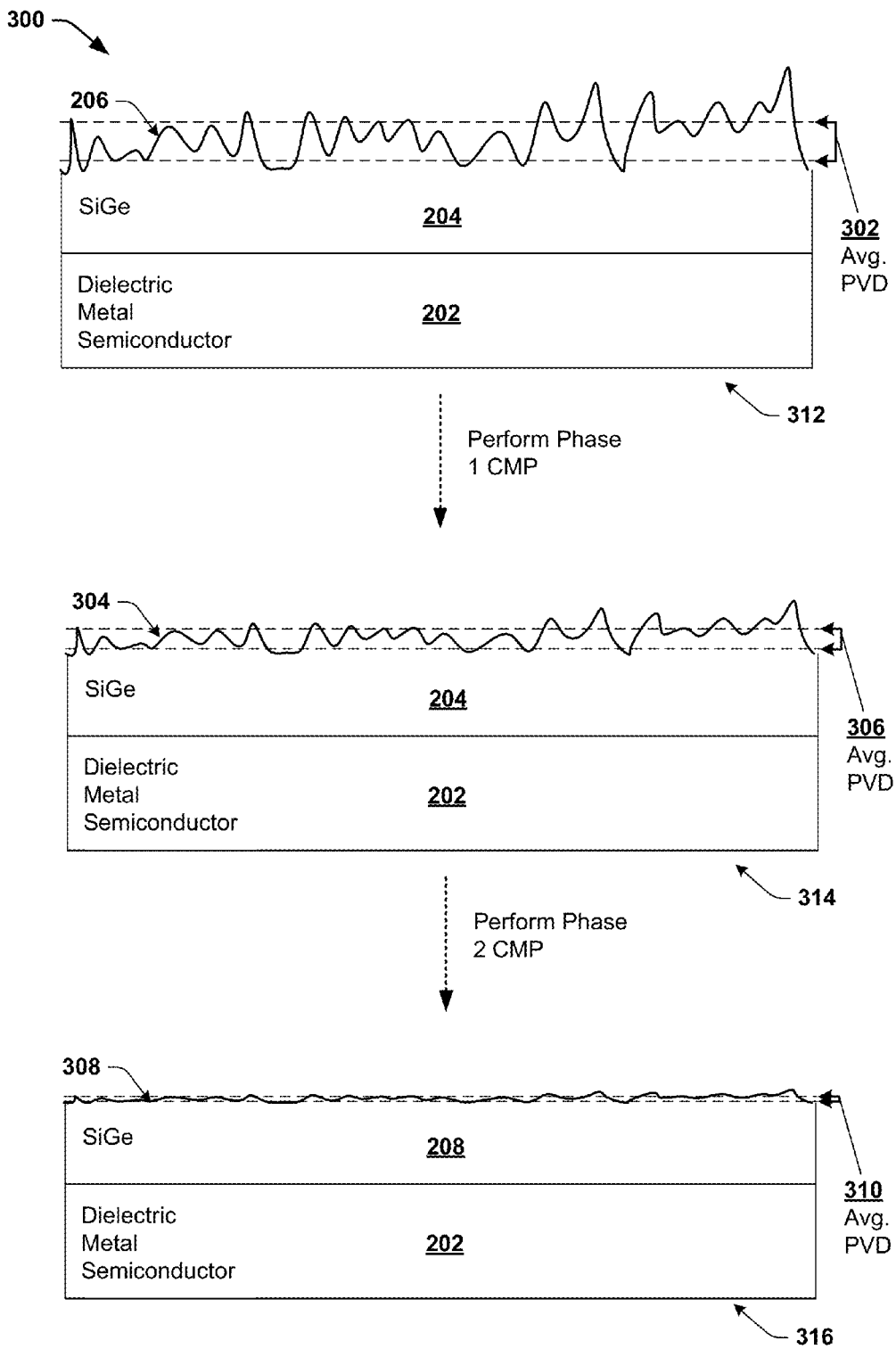
FIG. 3 depicts an example chemical mechanical planarization (CMP) process for removing surface roughness of a SiGe thin film according to one or more embodiments.

FIG. 3 depicts an example CMP process 300 for removing surface roughness of a SiGe thin film in accordance with aspects and embodiments described herein. Repetitive description of like elements employed in respective embodiments of processes and devices described herein is omitted for sake of brevity.

In an aspect, the CMP process is performed in a single step. However, in another aspect, the CMP process can be performed in multiple steps. For example, process 300 demonstrates an example CMP process employed to reduce surface roughness of a SiGe thin film that involves two steps or phases. Initially, structure 312 is formed following SiGe thin film deposition onto a planarized substrate 202. As previously noted the deposited SiGe thin film has a rough surface 206 that includes various projections or peaks and indentations or valleys. In an aspect, surface roughness of the SiGe thin film 204 can be a function of a distance between the highest peak and lowest valley (e.g., d3 previously described). In another aspect, surface roughness of the SiGe thin film 204 can be a function of an average peak to valley distance (PVD) based on the average distance between the respective peaks and valleys of the rough SiGe surface 206. In an aspect, the peak and valley points are measured with respect to a reference line (e.g., a midline or the base of the SiGe thin film 204 where the SiGe thin film meets the substrate 202). For example, with respect to structure 312, distance 302, (measured between the two dashed lines represents), represents the average PVD following initial deposition of the SiGe thin film 204.

During a first phase of CMP (e.g., Phase 1 CMP), surface roughness of the SiGe thin film is fully or partially reduced. For example, as seen with respect to structure 314, polished surface 304 includes reduced protrusions and indentions compared to surface 206. Further, the average PVD represented by distance 306 is smaller than the average PVD represented by distance 302. In an aspect, during the first phase of CMP, a silica slurry is applied to the rough surface 206 of structure 312. The silica slurry can contain between 0% and 20% $H_2O_2$ and have a pH greater than 9.0. SiGe removal rate during the first phase of CMP is between 1 to 10 nm/sec.

In an aspect, during the first phase of CMP, surface SiGe removal is about 50% to 100% of top layer of the SiGe thin film that includes the indentions and protrusions (e.g., the layer spanning thickness d3). This reduces the SiGe surface roughness without significantly reducing the initial SiGe thin film thickness. In another aspect, material of the SiGe thin film beyond the top surface layer including the peaks and valleys is removed. For example, where the surface roughness is formed in the top 10 nm of the SiGe thin film 204, the top 12 to 40 nm can be removed. In an aspect, the high SiGe peaks are removed faster than the low regions.

During a second phase of CMP (e.g., Phase 2 CMP), the surface roughness of the SiGe thin film is further reduced. For example, as seen with respect to structure 316, polished surface 308 includes reduced protrusions and indentions compared to surface 304. Further, the average PVD represented by distance 310 is smaller than the average PVD represented by distance 306. In an aspect, the SiGe removal rate during the second phase of CMP is between 0.2 to 5 nm/sec. The silica slurry employed in the second phase of CMP can have a same or different composition as the silica slurry employed in the first phase of CMP.

Figure 4:
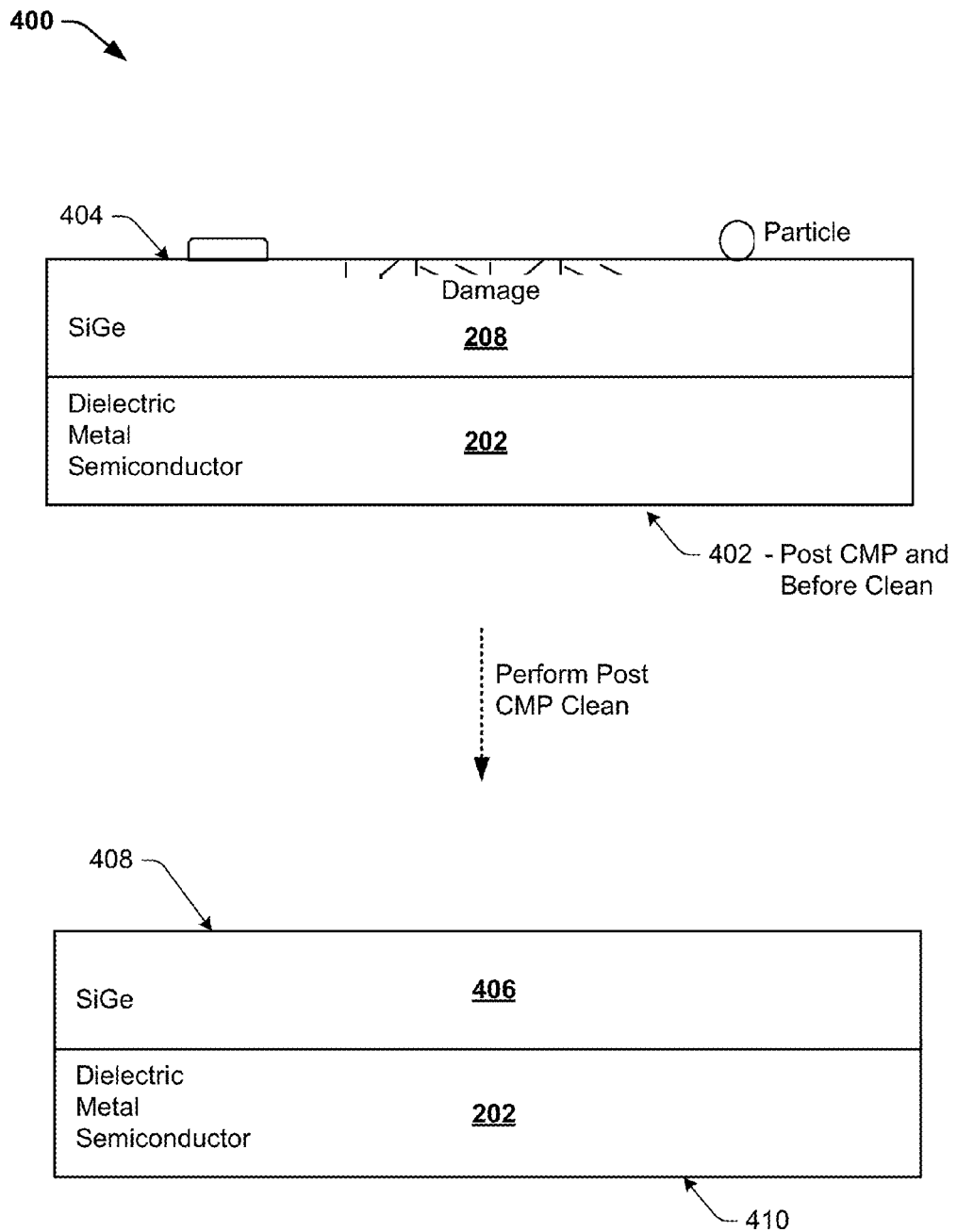
FIG. 4 presents an example process for further reducing surface roughness of a SiGe thin film following CMP in accordance with aspects and embodiments described herein.

FIG. 4 depicts an example process for further reducing surface roughness of a SiGe thin film following CMP in accordance with aspects and embodiments described herein. Repetitive description of like elements employed in respective embodiments of processes and devices described herein is omitted for sake of brevity.

A particular problem encountered in the CMP process is that micro scratches, particles and other damage can be formed on or around the polished SiGe surface. These microstructure irregularities adversely affect the smoothness and planarity of the SiGe layer upon which memory cells are to be subsequently formed. Thus in an aspect, following the CMP process applied to a SiGe thin film as discussed herein, a post CMP cleaning process can be applied to the SiGe thin film. Post CMP clean removes the surface damage of the SiGe and particles added at CMP.

For example, structure 402 depicts a resultant SiGe thin film, deposited on a substrate 202 and subjected to CMP in accordance with aspects described herein. The surface 404 of the resultant SiGe thin film is marked by various types of damage (e.g., micro scratches) and particles as a result of the CMP. In order to remove this damage and particles, structure 202 is subjected to a post CMP clean. This post CMP clean removes surface particles and removes 1.0 to 2.0 nm of the top exposed layer of the SiGe thin film to remove the surface damage. For example, structure 410 depicts a final SiGe thin film 406 following CMP and a CMP post clean procedure. The final SiGe thin film has a smooth surface 408 without surface defects and damage caused by the CMP. In an aspect, the post CMP clean includes application of at least one of: plasma $O_2$, $CF_4$, wet $H_2SO_4/H_2O_2/H_2O$ mixture, Ozone/$H_2O$, $H_2O_2$/HF, $NH_4OH/H_2O/H_2O_2$ or ozone/HF.

FIGS. 5A and 5B depict example memory cells 500 and 501 respectively, employing a SiGe thin film as a bottom electrode. Repetitive description of like elements employed in respective embodiments of processes and devices described herein is omitted for sake of brevity.

Memory cells 500 and 501 each include a SiGe thin film formed over a substrate. The substrate 202 can include a variety of suitable materials, including but not limited to a dielectric material, a metal, or a semiconductor material. In an aspect, the SiGe thin film serves as a bottom electrode for the memory cells. Memory cells 500 and 501 further include an interlayer dielectric (ILD) 504 that can be formed over the SiGe layer and a conductive material 502 that can be formed over the ILD layer 504. The ILD layer can include any suitable dielectric material. In an aspect, the ILD layer is formed using at least one of $SiO_2$, $Si_3N_4$, FSG, or low K. In some aspects, the ILD includes resistive switching properties, and may be a undoped amorphous silicon, non-crystalline silicon, intrinsic silicon, a non-stoichiometric silicon oxide (e.g. silicon sub-oxide, SiOx, 0<x<2), or the like. The conductive material 502 can include any suitable conductive material that can serve as a top electrode. For example, the conductive material 502 can be made of one or more conductive materials that can produce free ions in response to an applied electric field, for instance. In alternative embodiments, conductive material 502 can facilitate generation of ions within, or migration of ions throughout, a switching medium of memory cell 500 or 501. In some embodiments, conductive material 502 can be an elemental metal and not an ionically bonded material. Examples can include Ag, Cu, Ti, Al, Pd, W, TiN, or the like, or a suitable combination thereof. Furthermore, the above-mentioned top electrode can include one or more additional layers (some very thin, e.g., 2 to 3 nm) such as Ti, TiN, W, or the like, above the top electrode or between the top electrode and an associated switching layer 504 serving as a barrier layer(s), or the like.

Memory cell 500 demonstrates a memory cell employing SiGe thin film 204 deposited on substrate 202, wherein the SiGe thin film 204 was not subjected to planarization using the methods disclosed herein. Memory cell 501 demonstrates a memory cell employing SiGe thin film 406 deposited onto substrate 202 wherein the SiGe thin film was subjected to planarization using the methods disclosed herein (e.g., CMP and CMP post clean). In particular, in memory cell 500, the SiGe thin film 204 has a rough or jagged surface while in memory cell 501, the SiGe thin film 406 has a smooth surface.

With memory cell 500, current leakage between the SiGe thin film 204 and the conductive material 502 can occur in the ILD layer 504 as a result of the irregular and jagged surface of the SiGe thin film. In particular, due to the irregular projections and indentions in the surface of the SiGe thin film 204, the ILD layer formed over the SiGe thin film 204 has irregular variations in thickness. As a result, it is difficult to control current leakage in both the horizontal and vertical directions, especially at thinner points in the ILD layer 504. However, with memory cell 501, current leakage between the SiGe thin film 406 and the conductive material 502 via the ILD layer 504 is reduced or prevented as a result of the smooth surface of the SiGe thin film 406.

In various embodiments, memory cell 500 or memory cell 501 can comprise one or more other layers (not depicted). For instance, an intermediary layer(s) can be instituted adjacent to one or more layers depicted by memory cell 500 or memory cell 501. As one example, a suitable material that mitigates or controls unintended oxidation can be situated adjacent to or between one or more other layers depicted by memory cell 500 or memory cell 501. As another example, memory cell 500 or memory cell 501 can have fewer layers than depicted or described above. For instance, a top electrode (e.g., conductive material 502) can be removed and ILD 504 can electrically contact a conductive bitline, wordline, data line, etc., of a memory array. Accordingly, it is to be appreciated that suitable variations of memory cell 500 or memory cell 501 known in the art or made known to one of ordinary skill in the art by way of the context provided herein are considered within the scope of the present disclosure.

Figure 6B:
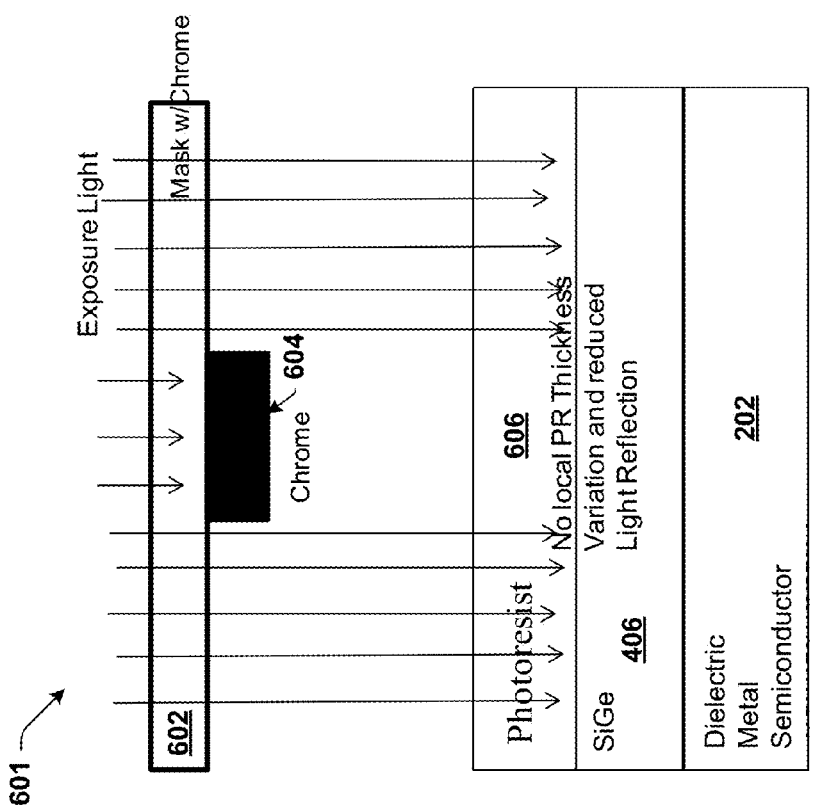
FIGS. 6A and 6B demonstrate patterning a SiGe thin film that has been processed to remove surface roughness in comparison with a SiGe thin film that has not been processed to remove surface roughness in accordance with aspects and embodiments described herein.
Figure 6A:
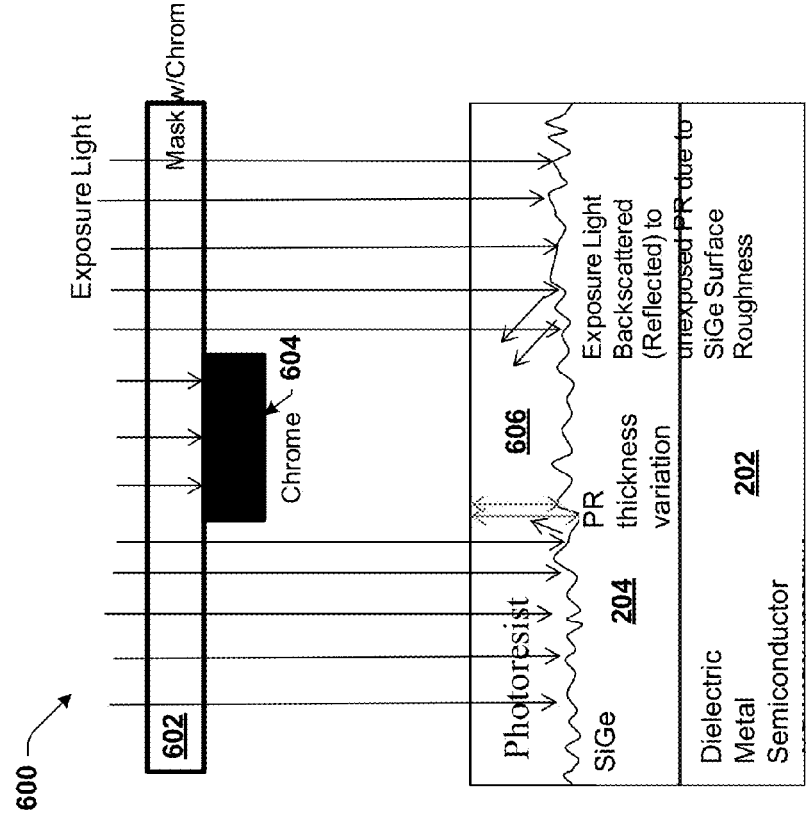

FIGS. 6A and 6B demonstrate patterning a SiGe thin film that has been processed to remove surface roughness in comparison with a SiGe thin film that has not been processed to remove surface roughness in accordance with aspects and embodiments described herein. Repetitive description of like elements employed in respective embodiments of processes and devices described herein is omitted for sake of brevity.

FIG. 6A presents a system 600 that includes a patterning unit consisting of a mask 602 with a chrome light blocker 604 and a memory device precursor consisting of a substrate 202 having a SiGe thin film 204 formed thereon and a photoresist (PR) 606 formed over the SiGe thin film. The patterning unit can be used to pattern the photoresist 606 via application of exposure light to the patterning unit using conventional techniques. As seen in FIG. 6A, the SiGe thin film 204 has a jagged surface. The jagged surface of the SiGe thin film 204 causes various photolithography defects. For example, due to the variation in surface roughness of the SiGe thin film 204, the PR has irregular variation in thickness. This non-uniform thickness of the PR cases photolithography CD variation and various other photolithography defects. These photolithography defects can subsequently lead to etch defects. For example, where the PR 606 is too thick (as a result of the variation), residual SiGe can remain following photolithography. Thus the SiGe surface roughness can cause increased etch times to remove residual SiGe. In another example, SiGe surface roughness causes inadvertent exposure to non-targeted areas of the PR 606 because of stray reflection off a rough area of the SiGe surface.

System 601 is similar to system 600 aside from replacement of the unprocessed SiGe thin film 204 having the rough surface with a SiGe thin film 406 having a smooth surface. SiGe thin film 406 has a smooth surface as a result of the processing techniques disclosed herein (e.g., CMP and post CMP clean). With system 601, the various photolithography defects caused by SiGe surface roughness are reduced or eliminated. In particular, the less SiGe surface roughness provides a more planar surface so that the PR 606 thickness on the SiGe film is more uniform. Uniform PR thickness produces better CD control and less chance of residual SiGe caused areas where the PR 606 is too thick. In addition, the smoother SiGe Surface eliminates inadvertent exposure of PR because of stray reflection off a rough SiGe surface.

Figure 7:
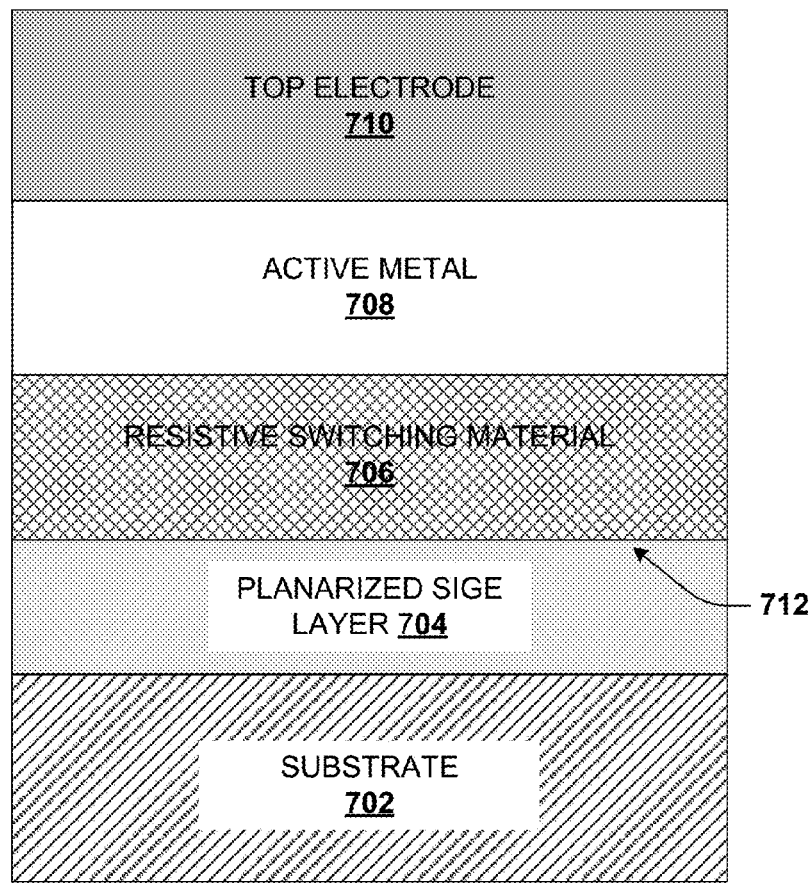
FIG. 7 depicts an exemplary memory cell in accordance with aspects and embodiments disclosed herein.

FIG. 7 depicts an exemplary memory cell 700 in accordance with aspects and embodiments disclosed herein. Memory cell 700 is formed with an SiGe film/layer 704 having a substantially smooth or planarized surface (e.g., surface 712). In particular, the SiGe layer 704 can be planarized using CMP such that it has a degree of surface roughness less than 1.0 nm RMS. In an aspect, the SiGe layer has a thickness less than about 350 nm.

In an aspect, the SiGe layer 704 is formed of a planarized substrate 702 (e.g., a dielectric substrate, a metal substrate, or a semiconductor substrate). For example, substrate 702 can include semiconductor substrate having a plurality of CMOS devices formed therein. In an aspect, the SiGe layer 704 is in contact with a bottom electrode (e.g., not shown). For example, a bottom electrode can be adjacent to the SiGe layer 704 and within the substrate 702. In another example, a bottom electrode can be adjacent to the SiGe layer 704 and between the SiGe layer and the substrate 702. In another aspect, the SiGe layer can function as a bottom electrode.

A resistive switching material 706 is formed adjacent to the planarized surface 712 of the SiGe layer 704. The resistive switching material 706 can include at least one of, undoped amorphous silicon material, non-crystalline silicon material, intrinsic silicon, or an silicon-sub-oxide. An active metal layer 708 is formed adjacent to the resistive switching material 706. In an aspect, the active metal layer is selected from a group consisting of aluminum, silver, and gold. Further, top electrode layer is formed adjacent to the active metal material 708. The top electrode can include aluminum, copper, Ti, TiN, W, or the like.

The aforementioned diagrams have been described with respect to interaction between several components (e.g., layers) of a memory cell, or memory architectures comprised of such memory cells. It should be appreciated that in some suitable alternative aspects of the subject disclosure, such diagrams can include those components and layers specified therein, some of the specified components/layers, or additional components/layers. Sub-components can also be implemented as electrically connected to other sub-components rather than included within a parent component/layer. Additionally, it is noted that one or more disclosed processes can be combined into a single process providing aggregate functionality. For instance, a program process can comprise a read process, or vice versa, to facilitate programming and reading a semiconductor cell by way of a single process. In addition, it should be appreciated that components of the disclosed architectures can also interact with one or more other components not specifically described herein but known by those of skill in the art.

Figure 8:
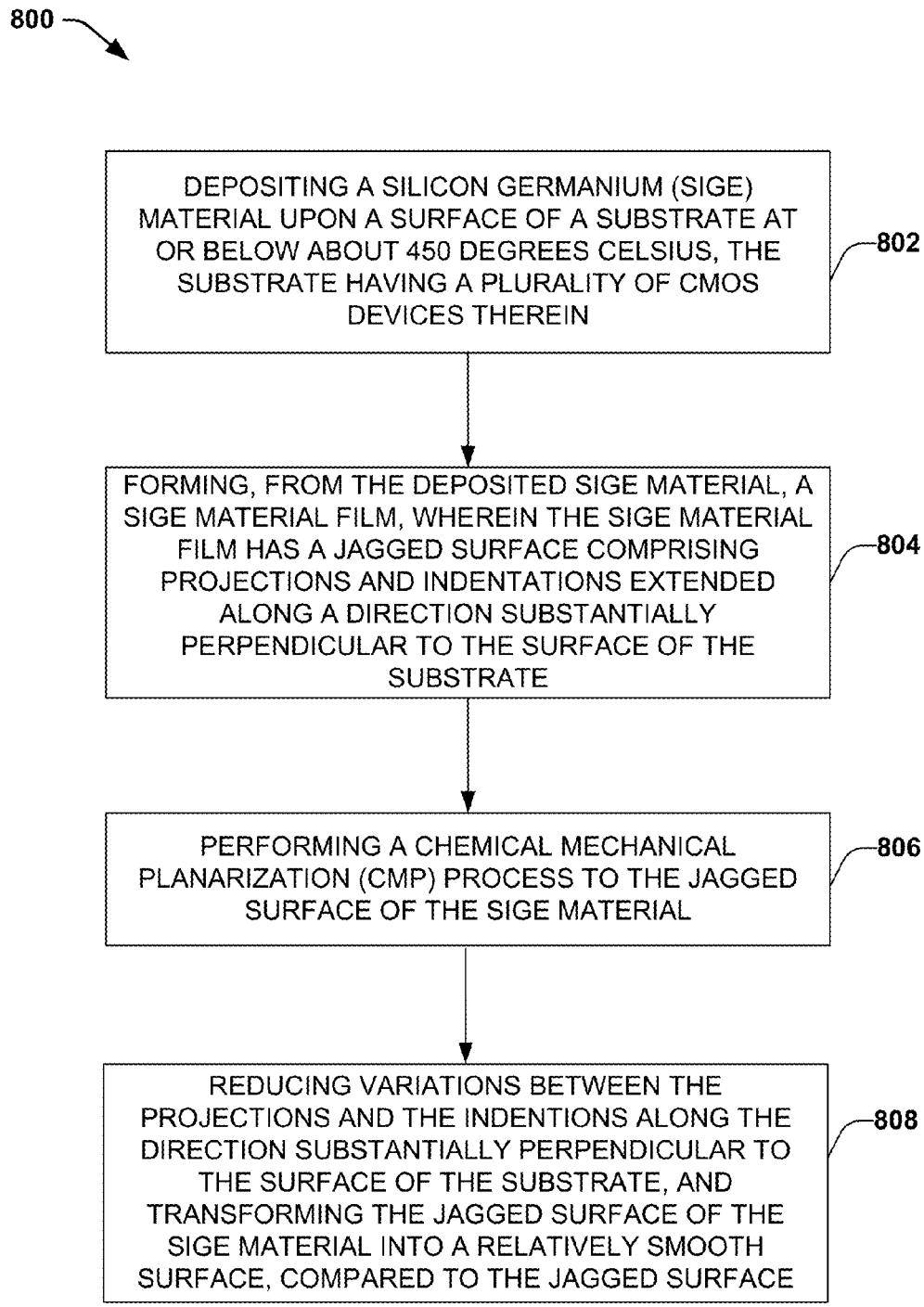
FIG. 8 illustrates a flow diagram of another example method for processing a SiGe thin film to reduce surface roughness thereof following deposition according to some embodiments of the subject disclosure.
Figure 9:
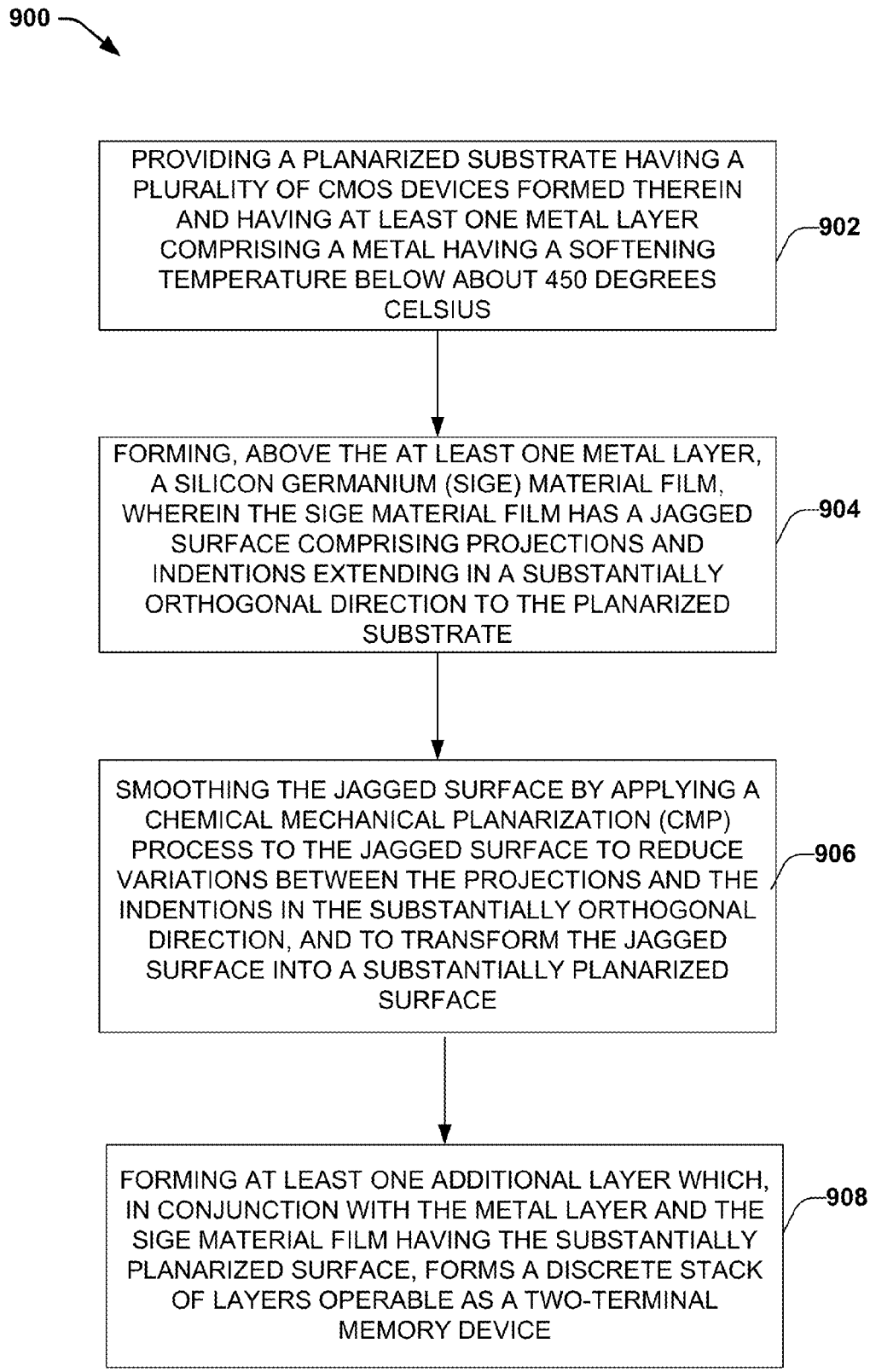
FIG. 9 illustrates a flow diagram of an example method for forming a memory cell in accordance with various aspects and embodiments.

In view of the exemplary diagrams described supra, process methods that can be implemented in accordance with the disclosed subject matter will be better appreciated with reference to the flow chart of FIGS. 8-9. While for purposes of simplicity of explanation, the method of FIGS. 8-9 is shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 8 depicts a flowchart of another example method 800 for processing a SiGe thin film to reduce surface roughness thereof in accordance with aspects and embodiments disclosed herein. At 802, SiGe is deposited (e.g., using PECVD or LPCVD) upon a surface of a substrate at or below about 450 degrees Celsius, the substrate having a plurality of CMOS devices therein. At 804, a SiGe material film is formed from the deposited SiGe material film. The SiGe material film has a jagged surface comprising projections and indentations extended along a direction substantially perpendicular to the surface of the substrate. At 806, CMP is applied to the jagged surface of the SiGe material film. At 808, variations between the projections and the indentions along the direction substantially perpendicular to the surface of the substrate, and transforming the jagged surface of the SiGe material into a relatively smooth surface, compared to the jagged surface.

In an aspect, after the SiGe material film is smoothed or planarized, one or more additional layers are formed on the relatively smooth surface of the SiGe material film to create a discrete stack of layers at least in part above the substrate, wherein the discrete stack of layers forms a discrete two-terminal memory cell that is configured for operation by one or more of the plurality of CMOS devices within the substrate. For example, a resistive switching layer can be formed adjacent to the relatively smooth surface, wherein the resistive switching layer is selected from a group consisting of: undoped amorphous silicon material, non-crystalline silicon material, intrinsic silicon, and silicon-sub-oxide. An active metal layer can be formed adjacent to the resistive switching layer, wherein the active metal material is selected from a group consisting of: aluminum, silver, platinum, palladium and gold, and a second electrode layer can be formed adjacent to the active metal layer, wherein the second electrode layer comprises a metal material selected from a group consisting of: aluminum, copper and silver. According to this aspect, the substrate can include a first electrode layer of the discrete two-terminal memory cell, wherein the SiGe material film is in contact with the first electrode layer.

FIG. 9 depicts a flowchart of an example method 900 for forming a memory cell in accordance with aspects and embodiments disclosed herein. At 902, a planarized substrate having a plurality of CMOS devices formed therein and having at least one metal layer comprising a metal having a softening temperature below about 450 degrees Celsius is provided. At 904, a silicon germanium (SiGe) material film is formed above the at least one metal layer, wherein the SiGe material film has a jagged surface comprising projections and indentions extending in a substantially orthogonal direction to the planarized substrate. At 906, the jagged surface is smoothed by applying a chemical mechanical planarization (CMP) process to the jagged surface to reduce variations between the projections and the indentions in the substantially orthogonal direction, and to transform the jagged surface into a substantially planarized surface. Then at 908, at least one additional layer is formed, which in conjunction with the metal layer and the SiGe material film having the substantially planarized surface, forms a discrete stack of layers operable as a two-terminal memory device. For example, additional layers, including a dielectric layer and a conductive layer, can be formed over the smooth surface of the SiGe thin film. In an aspect, formation of these additional layers can include photolithography etching of the SiGe thin film. As previously noted, photolithography can be successfully employed to etch the SiGe thin film due to the reduction in surface roughness via CMP and CMP post clean techniques disclosed herein.

In various embodiments, formation of the two-terminal memory device using the SiGe film includes depositing a resistive switching material onto the smoothed surface of the SiGe film and then depositing an active metal onto the resistive switching material. The resistive switching material can include at least one of undoped amorphous silicon material, non-crystalline silicon material, intrinsic silicon, or silicon-sub-oxide and the active metal can include at least one of aluminum, silver, or gold. In various embodiments, SiGe, resistive switching material, and active metal material are then etched to form a pillar-like structure. In other embodiments, after SiGe is smoothed, it is patterned into pillar-like structures, and a dielectric material is filled in-between the SiGe structures, while exposing a top surface of the SiGe structures. Subsequently, the resistive switching material and active metal material is deposited over the top surface of the SiGe structures, and then patterned.

Figure 10:
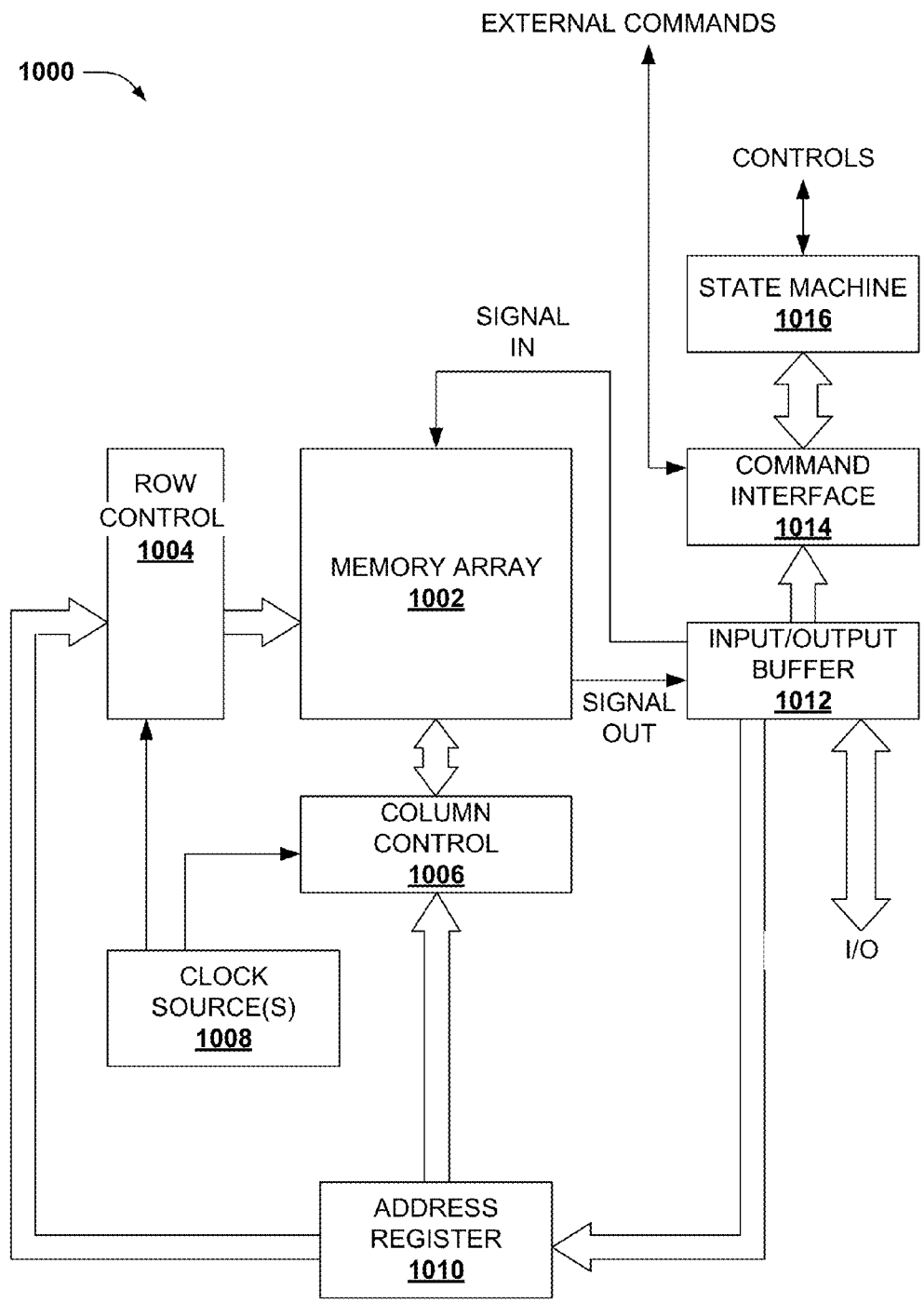
FIG. 10 depicts a block diagram of a sample operating environment for facilitating implementation of one or more disclosed embodiments.

In order to provide a context for the various aspects of the disclosed subject matter, FIG. 10, as well as the following discussion, is intended to provide a brief, general description of a suitable environment in which various aspects of the disclosed subject matter can be implemented or processed. While the subject matter has been described above in the general context of electronic memory and process methodologies for fabricating and operating such electronic memory or components/layers thereof, those skilled in the art will recognize that the subject disclosure also can be implemented in combination with other electronic memory technologies, memory architectures or process methodologies. Moreover, those skilled in the art will appreciate that the disclosed processes can be practiced with a processing system or a computer processor, either alone or in conjunction with a host computer (e.g., computer 1002 of FIG. 10, infra), which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory, or the like. In a distributed computing environment, program modules can be located in both local and remote memory storage modules or devices.

In addition to the foregoing, in various disclosed embodiments, disclosed memory devices or components thereof can be employed as a standalone or integrated embedded memory device with a CPU or microcomputer (or, e.g., a nanocomputer, and so forth). Some embodiments can be implemented as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact Flash (CF) card, or the like, or a suitable combination of the foregoing.

NAND Flash is employed for compact Flash devices, USB devices, SD cards, solid state drives (SSDs), and storage class memory, as well as other form-factors. Although NAND has proven a successful technology in fueling the drive to scale down to smaller devices and higher chip densities over the past decade, as technology has scaled down past 25 nm memory cell technology, several structural, performance, and reliability problems became evident to the inventors of the present disclosure. Accordingly, various aspects of the present disclosure are provided to address some or all of these considerations.

FIG. 10 illustrates a block diagram of an example operating and control environment 1000 for a memory cell array 1002 according to aspects of the subject disclosure. In at least one aspect of the subject disclosure, memory cell array 1002 can comprise a variety of memory cell technology (e.g., resistive switching memory cell technology). Particularly, memory cell array can comprise resistive switching memory cells having relatively smooth SiGe thin films, as described herein.

A column controller 1006 can be formed adjacent to memory cell array 1002. Moreover, column controller 1006 can be electrically coupled with bit lines of memory cell array 1002. Column controller 1006 can control respective bitlines, applying suitable program, erase or read voltages to selected bitlines.

In addition, operating and control environment 1000 can comprise a row controller 1004. Row controller 1004 can be formed adjacent to column controller 1006, and electrically connected with word lines of memory cell array 1002. Row controller 1004 can select particular rows of memory cells with a suitable selection voltage. Moreover, row controller 1004 can facilitate program, erase or read operations by applying suitable voltages at selected word lines.

A clock source(s) 1008 can provide respective clock pulses to facilitate timing for read, write, and program operations of row control 1004 and column control 1006. Clock source(s) 1008 can further facilitate selection of word lines or bit lines in response to external or internal commands received by operating and control environment 1000. An input/output buffer 1012 can be connected to an external host apparatus, such as a computer or other processing device (not depicted, but see e.g., computer 1202 of FIG. 12, infra) by way of an I/O buffer or other I/O communication interface. Input/output buffer 1012 can be configured to receive write data, receive an erase instruction, output readout data, and receive address data and command data, as well as address data for respective instructions. Address data can be transferred to row controller 1004 and column controller 1006 by an address register 1010. In addition, input data is transmitted to memory cell array 1002 via signal input lines, and output data is received from memory cell array 1002 via signal output lines. Input data can be received from the host apparatus, and output data can be delivered to the host apparatus via the I/O buffer.

Commands received from the host apparatus can be provided to a command interface 1014. Command interface 1014 can be configured to receive external control signals from the host apparatus, and determine whether data input to the input/output buffer 1012 is write data, a command, or an address. Input commands can be transferred to a state machine 1016.

State machine 1016 can be configured to manage programming and reprogramming of memory cell array 1002. State machine 1016 receives commands from the host apparatus via input/output interface 1012 and command interface 1014, and manages read, write, erase, data input, data output, and like functionality associated with memory cell array 1002. In some aspects, state machine 1016 can send and receive acknowledgments and negative acknowledgments regarding successful receipt or execution of various commands.

To implement read, write, erase, input, output, etc., functionality, state machine 1016 can control clock source(s) 1008. Control of clock source(s) 1008 can cause output pulses configured to facilitate row controller 1004 and column controller 1006 implementing the particular functionality. Output pulses can be transferred to selected bit lines by column controller 1006, for instance, or word lines by row controller 1004, for instance.

In connection with FIG. 10, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 11:
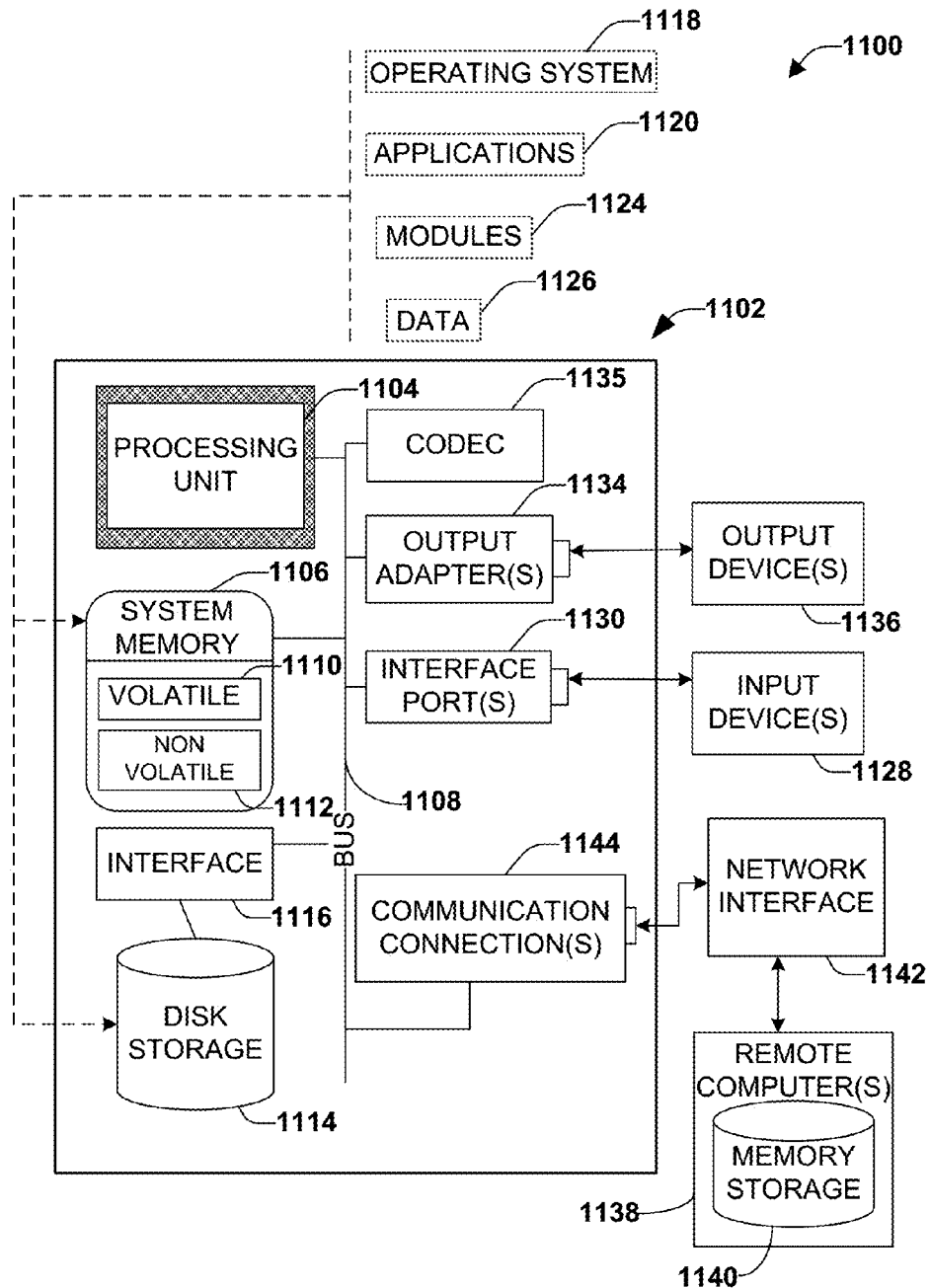
FIG. 11 illustrates a block diagram of an example computing environment that can be implemented in conjunction with various embodiments.

With reference to FIG. 11, a suitable environment 1100 for implementing various aspects of the claimed subject matter includes a computer 1102. The computer 1102 includes a processing unit 1104, a system memory 1106, a codec 1135, and a system bus 1108. The system bus 1108 couples system components including, but not limited to, the system memory 1106 to the processing unit 1104. The processing unit 1104 can be any of various available processors. Dual microprocessors and other multiprocessor architectures also can be employed as the processing unit 1104.

The system bus 1108 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1106 includes volatile memory 1110 and non-volatile memory 1112, which can employ one or more of the disclosed memory architectures, in various embodiments. The basic input/output system (BIOS), containing the basic routines to transfer information between elements within the computer 1102, such as during start-up, is stored in non-volatile memory 1112. In addition, according to the present disclosure, codec 1135 may include at least one of an encoder or decoder, wherein the at least one of an encoder or decoder may consist of hardware, software, or a combination of hardware and software. Although, codec 1135 is depicted as a separate component, codec 1135 may be contained within non-volatile memory 1112. By way of illustration, and not limitation, non-volatile memory 1112 can include read only memory (ROM), programmable ROM (PROM), electrically programmable ROM (EPROM), electrically erasable programmable ROM (EEPROM), or Flash memory. Non-volatile memory 1112 can employ one or more of the disclosed memory architectures, in at least some disclosed embodiments. Moreover, non-volatile memory 1112 can be computer memory (e.g., physically integrated with computer 1102 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1111 includes cache memory, or random access memory (RAM), which acts as external cache memory, and can also employ one or more disclosed memory architectures in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 1102 may also include removable/non-removable, volatile/non-volatile computer storage medium. FIG. 11 illustrates, for example, disk storage 1114. Disk storage 1114 includes, but is not limited to, devices like a magnetic disk drive, solid state disk (SSD) floppy disk drive, tape drive, Jaz drive, Zip drive, LS-110 drive, flash memory card, or memory stick. In addition, disk storage 1114 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1114 to the system bus 1108, a removable or non-removable interface is typically used, such as interface 1116. It is appreciated that storage devices 1114 can store information related to a user. Such information might be stored at or provided to a server or to an application running on a user device. In one embodiment, the user can be notified (e.g., by way of output device(s) 1136) of the types of information that are stored to disk storage 1114 and/or transmitted to the server or application. The user can be provided the opportunity to opt-in or opt-out of having such information collected and/or shared with the server or application (e.g., by way of input from input device(s) 1128).

It is to be appreciated that FIG. 11 describes software that acts as an intermediary between users and the basic computer resources described in the suitable operating environment 1100. Such software includes an operating system 1118. Operating system 1118, which can be stored on disk storage 1114, acts to control and allocate resources of the computer system 1102. Applications 1120 take advantage of the management of resources by operating system 1118 through program modules 1124, and program data 1126, such as the boot/shutdown transaction table and the like, stored either in system memory 1106 or on disk storage 1114. It is to be appreciated that the claimed subject matter can be implemented with various operating systems or combinations of operating systems.

A user enters commands or information into the computer 1102 through input device(s) 1128. Input devices 1128 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1104 through the system bus 1108 via interface port(s) 1130. Interface port(s) 1130 include, for example, a serial port, a parallel port, a game port, and a universal serial bus (USB). Output device(s) 1136 use some of the same type of ports as input device(s) 1128. Thus, for example, a USB port may be used to provide input to computer 1102 and to output information from computer 1102 to an output device 1136. Output adapter 1134 is provided to illustrate that there are some output devices 1136 like monitors, speakers, and printers, among other output devices 1136, which require special adapters. The output adapters 1134 include, by way of illustration and not limitation, video and sound cards that provide a means of connection between the output device 1136 and the system bus 1108. It should be noted that other devices and/or systems of devices provide both input and output capabilities such as remote computer(s) 1138.

Computer 1102 can operate in a networked environment using logical connections to one or more remote computers, such as remote computer(s) 1138. The remote computer(s) 1138 can be a personal computer, a server, a router, a network PC, a workstation, a microprocessor based appliance, a peer device, a smart phone, a tablet, or other network node, and typically includes many of the elements described relative to computer 1102. For purposes of brevity, only a memory storage device 1140 is illustrated with remote computer(s) 1138. Remote computer(s) 1138 is logically connected to computer 1102 through a network interface 1142 and then connected via communication connection(s) 1144. Network interface 1142 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1144 refers to the hardware/software employed to connect the network interface 1142 to the bus 1108. While communication connection 1144 is shown for illustrative clarity inside computer 1102, it can also be external to computer 1102. The hardware/software necessary for connection to the network interface 1142 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method, comprising:
    depositing a silicon germanium (SiGe) material upon a surface of a substrate at or below about 450 degrees Celsius, the substrate having a plurality of CMOS devices therein;
    forming, from the deposited SiGe material, a SiGe material film, wherein the SiGe material film has a jagged surface comprising projections and indentations extended along a direction substantially perpendicular to the surface of the substrate;
    performing a chemical mechanical planarization (CMP) process to the jagged surface of the SiGe material;
    reducing variations between the projections and the indentations along the direction substantially perpendicular to the surface of the substrate, and transforming the jagged surface of the SiGe material into a relatively smooth surface, compared to the jagged surface; and
    forming one or more additional materials overlying the relatively smooth surface of the SiGe material film to create a discrete stack of layers at least in part above the substrate, wherein the discrete stack of layers forms a discrete two-terminal memory cell.

2. The method of claim 1, further comprising:
    providing a circuit to selectively connect the discrete two-terminal memory cell with one or more of the plurality of CMOS devices within the substrate, facilitating control of the discrete two-terminal memory cell by the one or more of the plurality of CMOS devices.

3. The method of claim 2, wherein the substrate comprises a first electrode layer of the discrete two-terminal memory cell and wherein the SiGe material film is in contact with the first electrode layer.

4. The method of claim 2, wherein the forming the one or more additional layers comprises forming a dielectric layer over the relatively smooth surface of the SiGe material film.

5. The method of claim 1, wherein the SiGe material film comprises a doped poly-crystalline silicon germanium material, wherein dopants within the SiGe material film are activated in conjunction with depositing the SiGe material and without an anneal process.

6. The method of claim 1, wherein the SiGe material film has a deposited thickness between about 100 nanometers (nm) and about 350 nm.

7. The method of claim 1,
    wherein the reducing variations between the projections and indentions comprises reducing a length of at least a subset of the projections along the direction substantially perpendicular to the surface of the substrate.

8. The method of claim 7, wherein a distance along the direction substantially perpendicular to the surface of the substrate between the projections and indentations is less than about 10% of a total thickness of the SiGe material film.

9. The method of claim 1, wherein the reducing variations between the projections and the indentions along the direction substantially perpendicular to the surface of the substrate further comprises reducing a magnitude of the variations by more than about 50%.

10. The method of claim 1, wherein the depositing the SiGe material comprises using a low temperature plasma-enhanced chemical vapor deposition (PECVD) or low pressure chemical vapor deposition (LPCVD) to deposit the SiGe material.

11. The method of claim 1, further comprising providing a post-CMP cleaning for the relatively smooth surface of the SiGe material to mitigate or remove surface damage or particles on the relatively smooth surface following the performing the CMP process.

12. The method of claim 11, wherein providing the post-CMP cleaning further comprises applying plasma $O_2$, and removing about 1.0 nm to about 5.0 nm of the relatively smooth surface from the SiGe material film.

13. The method of claim 1, wherein performing the CMP process further comprises:
    applying a first CMP process to remove SiGe material at a rate of about 1.0 nm to about 10.0 nm per second from the SiGe material film; and thereafter
    applying a second CMP process to remove SiGe material at a rate of about 0.2 nm to about 5.0 nm per second from the SiGe material film.

14. The method of claim 1, further comprising:
    forming a resistive switching layer adjacent to the relatively smooth surface, wherein the resistive switching layer is selected from a group consisting of: undoped amorphous silicon material, non-crystalline silicon material, intrinsic silicon, and silicon-sub-oxide;
    forming an active metal layer adjacent to the resistive switching layer, wherein the active metal material is selected from a group consisting of: aluminum, silver, platinum, palladium and gold; and
    forming an electrode layer adjacent to the active metal layer, wherein the electrode layer comprises a metal material selected from a group consisting of: aluminum, copper and silver.

15. A method, comprising:
providing a planarized substrate having a plurality of CMOS devices formed therein and having at least one metal layer comprising a metal having a softening temperature below about 450 degrees Celsius;
forming, above the at least one metal layer, a silicon germanium (SiGe) material film, wherein the SiGe material film has a jagged surface comprising projections and indentions extending in a substantially orthogonal direction to the planarized substrate;
smoothing the jagged surface by applying a chemical mechanical planarization (CMP) process to the jagged surface to reduce variations between the projections and the indentions in the substantially orthogonal direction, and to transform the jagged surface into a substantially planarized surface; and
forming at least one additional layer which, in conjunction with the metal layer and the SiGe material film having the substantially planarized surface, forms a discrete stack of layers operable as a two-terminal memory device.

16. The method of claim 15, wherein the forming the at least one additional layer comprises:
forming a dielectric layer over the substantially planarized surface; and
forming a conductive layer over the dielectric layer.

17. The method of claim 15, wherein the forming the at least one additional layer comprises:
patterning the substantially planarized surface using photolithography.

18. The method of claim 15, wherein the SiGe material film has a deposited thickness between about 30 nanometers (nm) and about 400 nm.

19. The method of claim 15, wherein a maximum distance between the projections and indentations in the substantially orthogonal direction is less than about 10% of a total thickness of the SiGe material film, and wherein the smoothing the jagged surface further comprises reducing the variations between the projections and the indentions by more than about 50%.

20. The method of claim 15, wherein the forming the at least one additional layer further comprises:
forming a resistive switching material adjacent to the substantially planarized surface, wherein the resistive switching material is selected from a group consisting of: undoped amorphous silicon material, non-crystalline silicon material, intrinsic silicon and silicon-sub-oxide;
forming an active metal material adjacent to the resistive switching material, wherein the active metal material is selected from a group consisting of: aluminum, platinum, palladium, silver and gold; and
forming a second electrode adjacent to the active metal material, wherein the second electrode comprises a metal material selected from a group consisting of: aluminum, copper and silver, and wherein the discrete stack of layers comprises respective adjacent subsets of the at least one metal layer, the SiGe material film, the resistive switching material, the active metal material and the second electrode.

21. A memory device, comprising:
a planarized substrate having a plurality of CMOS devices formed therein;
a first conductive layer formed on the planarized substrate;
a SiGe material film formed over the planarized substrate and in contact with the first conductive layer, wherein the SiGe material film has a thickness less than about 350 nm and a planarized surface opposite a surface of the SiGe material film contacting the first conductive layer, wherein the planarized surface is formed at least in part using chemical mechanical planarization (CMP) applied to the SiGe material film as-deposited, and comprises a surface roughness that is less than 1.0 nm rms following application of the CMP;
a dielectric layer formed over the SiGe film material; and
a second conductive layer formed over the dielectric layer.

22. The memory device of claim 21, further comprising:
a resistive switching material adjacent to the planarized surface, wherein the resistive switching material is selected from a group consisting of: undoped amorphous silicon material, non-crystalline silicon material, intrinsic silicon and silicon-sub-oxide;
an active metal material adjacent to the resistive switching material, wherein the active metal material is selected from a group consisting of: aluminum, silver, platinum, palladium and gold; and
a second electrode adjacent to the active metal material, wherein the second electrode comprises a metal material selected from a group consisting of: aluminum, copper and silver.

23. The memory device of claim 21, wherein the planarized surface is formed further using a post-CMP cleaning process selected from the group consisting of: plasma $O_2$, a $CF_4$, a wet $H_2SO_4/H_2O_2/H_2O$ mixture, an ozone/$H_2O$, $H_2O_2$/HF mixture, a $NH_4OH/H_2O/H_2O_2$ mixture, or an ozone/HF mixture, or a combination thereof.

* * * * *